(12) United States Patent
Lin et al.

(10) Patent No.: US 6,970,057 B2
(45) Date of Patent: Nov. 29, 2005

(54) LOWPASS FILTER FORMED IN A MULTI-LAYER CERAMIC

(75) Inventors: Yo-Shen Lin, Taipei (TW); Ko-Mai Li, Taipei (TW)

(73) Assignee: Chi Mei Communication Systems, Inc., Jen Te Shiang (TW)

( * ) Notice: Subject to any disclaimer, the term of this patent is extended or adjusted under 35 U.S.C. 154(b) by 0 days.

(21) Appl. No.: 10/708,942

(22) Filed: Apr. 2, 2004

(65) Prior Publication Data

US 2005/0219011 A1    Oct. 6, 2005

(51) Int. Cl.$^7$ .............................................. H03H 7/09
(52) U.S. Cl. ..................................... 333/177; 333/185
(58) Field of Search ....................... 333/167, 177–181, 333/185

(56) References Cited

U.S. PATENT DOCUMENTS

| | | | | |
|---|---|---|---|---|
| 1,613,952 A | * | 1/1927 | Johnson | 333/171 |
| 2,153,857 A | * | 4/1939 | Wheeler | 333/169 |
| 3,858,126 A | * | 12/1974 | Kameya | 333/168 |
| 5,602,517 A | * | 2/1997 | Kaneko et al. | 333/185 |
| 6,114,925 A | * | 9/2000 | Lo | 333/185 |
| 6,476,689 B1 | * | 11/2002 | Uchida et al. | 333/177 |
| 6,483,400 B1 | * | 11/2002 | Phillips, Jr. | 333/185 |
| 6,587,025 B2 | * | 7/2003 | Smith et al. | 336/200 |

FOREIGN PATENT DOCUMENTS

JP    10013180 A    *    1/1998    ............ H03H 7/09

* cited by examiner

Primary Examiner—Seungsook Ham
(74) Attorney, Agent, or Firm—Winston Hsu

(57) ABSTRACT

A lowpass filter formed in a multi-layered substrate includes a first capacitor formed on at least one layer of the multi-layered substrate and being electrically connected to a first node, a first inductor being electrically connected to the first capacitor at the first node, and a second inductor being electrically connected to the first inductor and the first capacitor at the first node. In the lowpass filter, negative mutual inductance exists between the first inductor and the second inductor.

9 Claims, 18 Drawing Sheets

LOWPASS FILTER FORMED IN A MULTI-LAYER CERAMIC

BACKGROUND OF INVENTION

1. Field of the Invention

The present invention relates to a lumped-element elliptic lowpass filter, and more particularly, to a lumped-element elliptic lowpass filter realized in a multi-layered substrate.

2. Description of the Prior Art

Lowpass filters are widely used as building blocks in circuit designs. They are usually used to filter out unwanted spurious responses and harmonics of higher frequencies. Performance of lowpass filters is characterized by insertion losses in the passband and rejections in the stopband.

Please refer to FIG. 1. FIG. 1 is a prototype circuit of a conventional $n^{th}$-order lowpass filter 10, where n is an odd number. $P_1$ and $P_2$ are two ports of the lowpass filter 10. The lowpass filter 10 contains inductors $L_1, L_3, L_5, \ldots, L_n$ and capacitors $C_2, C_4, \ldots, C_{n-1}$. For cases in which the rejection in the stopband of the lowpass filter 10 shown in FIG. 1 is not enough to meet system requirements, an elliptic lowpass filter can be employed.

Please refer to FIG. 2. FIG. 2 is a prototype circuit of a conventional $n^{th}$-order elliptic lowpass filter 20, where n is an odd number. Compared with the lowpass filter 10 in FIG. 1, in the elliptic lowpass filter 20, additional inductors $L_{2j}$ are added in series with shunt capacitors $C_{2j}$, where j is a positive integer. The resulting series LC circuits will create notches in the insertion loss response within the stopband, and a better stopband rejection can be achieved.

Please refer to FIG. 3. FIG. 3 is a diagram of frequency responses for a conventional third-order lowpass filter and a conventional third-order elliptic lowpass filter. A solid line 21 represents the insertion loss of the conventional third-order lowpass filter, and a dotted line 22 represents the insertion loss of the conventional third-order elliptic lowpass filter. As shown in FIG. 3, there is a notch in the stopband of the elliptic filter, such that a better stopband rejection is achieved. In addition, the elliptic filter also exhibits sharper roll-off rate at the passband edge, which is usually considered a good characteristic for a lowpass filter.

Although elliptic lowpass filters exhibit much better performance compared to conventional lowpass filters, they require additional inductors. A larger number of circuit elements increases the circuit area needed. This is especially undesirable for modern wireless communication devices that are subject to stringent requirements on size and cost. Therefore, the task of designing a lowpass filter with fewer elements and a good rejection in the stopband has become an important topic in the advanced development of RF circuits.

SUMMARY OF INVENTION

It is therefore an objective of the claimed invention to provide a lowpass filter realized with lumped elements in a multi-layered substrate that can provide the response of an elliptic lowpass filter with fewer circuit elements.

According to the claimed invention, a lowpass filter formed in a multi-layered substrate includes a first capacitor formed on at least one layer of the multi-layered substrate and being electrically connected to a first node, a first inductor being electrically connected to the first capacitor at the first node, and a second inductor being electrically connected to the first inductor and the first capacitor at the first node. In the lowpass filter, negative mutual inductance exists between the first inductor and the second inductor.

According to the claimed invention, an $n^{th}$-order lowpass filter formed in a multi-layered substrate includes a first capacitor formed on at least one layer of the multi-layered substrate and being electrically connected to a first node, a first inductor being electrically connected to the first capacitor at the first node, and a second inductor electrically connected between the first node and a second node. The lowpass filter also contains m capacitor-inductor pairs. Each capacitor-inductor pair includes a capacitor electrically connected to an initial node of the capacitor-inductor pair and an inductor electrically connected between the initial node and a final node of the capacitor-inductor pair. The second node is the initial node for a first capacitor-inductor pair, and the initial node for each succeeding capacitor-inductor pair is the final node of each preceding capacitor-inductor pair. Negative mutual inductance exists between inductors that are electrically connected to a common node. A relationship between n and m is given in the equation n=2*m+3, where n is an odd integer greater than one, and m is a nonnegative integer.

It is an advantage of the claimed invention that the negative mutual inductance introduced between inductors connected to a common node gives the lowpass filter having a structure of a conventional lowpass filter the frequency response of a conventional elliptic lowpass filter. Therefore, an improved stopband rejection is achieved while decreasing the circuit area needed to build the lowpass filter. It is another advantage of the claimed invention that the lowpass filter formed in the multi-layered substrate has a stacked arrangement. The stacked arrangement allows the vertical arrangement of circuit components such that each layer can be built with a small area, thereby decreasing the overall area of the lowpass filter.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
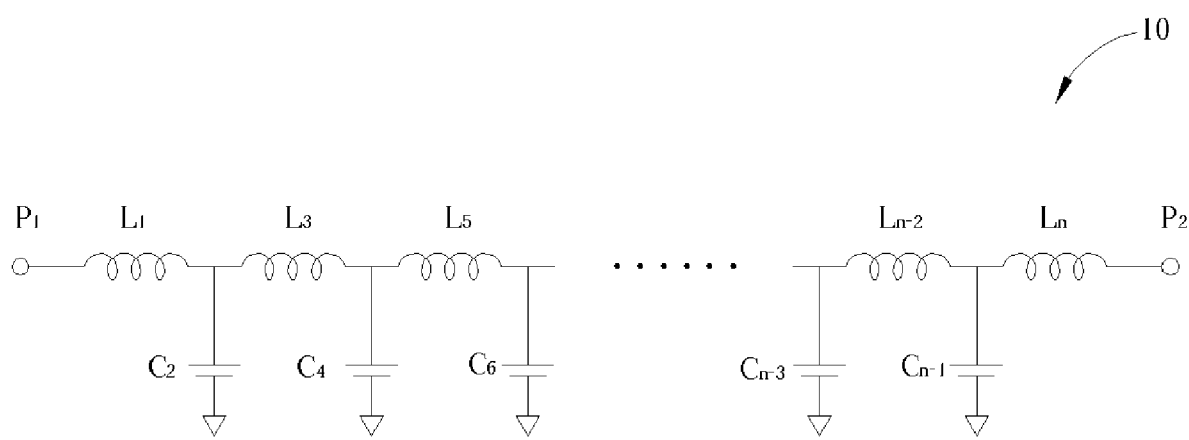
FIG. 1 is a prototype circuit of a conventional $n^{th}$-order lowpass filter, where n is an odd number.
Figure 4:
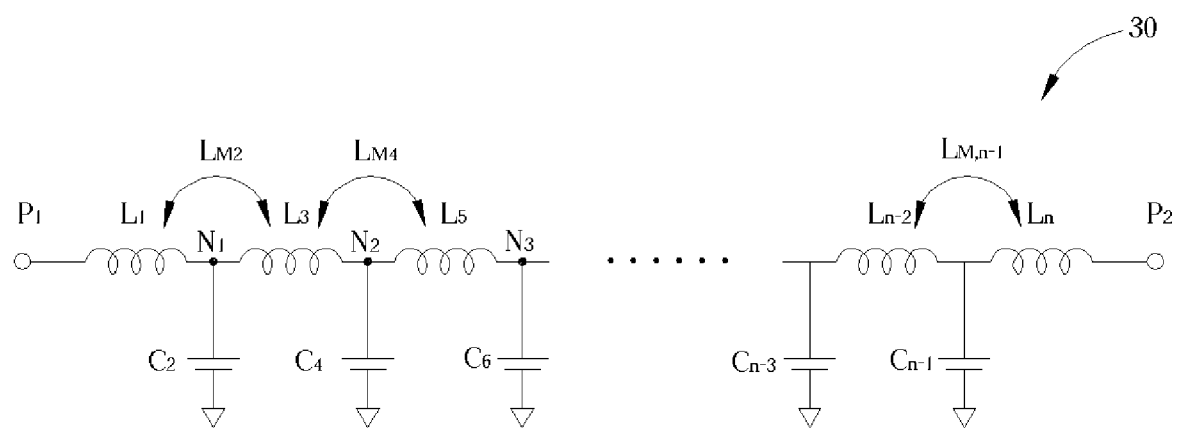
FIG. 4 illustrates a circuit model of a proposed lowpass filter according to the present invention.

Please refer to FIG. 4. FIG. 4 illustrates a circuit model of a proposed lowpass filter 30 according to the present invention. The lowpass filter 30 is based on the conventional $n^{th}$-order lowpass filter 10 shown in FIG. 1. The lowpass filter 30 contains inductors $L_1, L_3, L_5, \ldots, L_n$ and capacitors $C_2, C_4, \ldots, C_{n-1}$ where n is an odd number and indicates the order of the lowpass filter 30. The lowpass filter 30 is designed in such a way that adjacent inductors $L_1, L_3, L_5, \ldots, L_n$ (adjacent inductors in this case means they are connected to a common node) have a negative mutual inductance between them. In FIG. 4 the mutual inductances are labeled as $L_{Mi}$, i=2, 4, . . . , n−1. For instance, inductors L and L have a negative mutual inductance $L_{M2}$ between them.

The lowpass filter 30 is made up of a third-order lowpass filter plus m capacitor-inductor pairs. The third-order lowpass filter contains inductors $L_1$ and $L_3$ connected to a common node $N_1$. Inductor $L_1$ is connected between the common node $N_1$ and port $P_1$ of the lowpass filter 30. Inductor $L_3$ is connected between the common node $N_1$ and a second node $N_2$. A capacitor $C_2$ is connected between the common node $N_1$ and ground.

Each of the m capacitor-inductor pairs contains an additional inductor and capacitor. The inductor and the capacitor are each connected to an initial node of the capacitor-inductor pair. The inductor is connected between the initial node and a final node of the capacitor-inductor pair. The capacitor is connected between the initial node and ground. For example, a first capacitor-inductor pair contains inductor $L_5$ and capacitor $C_4$. The inductor $L_5$ is connected between initial node $N_2$ and final node $N_3$. The capacitor $C_4$ is connected between initial node $N_2$ and ground. The initial node for each succeeding capacitor-inductor pair is the same as the final node for the preceding capacitor-inductor pair. In FIG. 4, the last capacitor-inductor pair is made up of inductor $L_n$ and capacitor $C_{n-1}$ with inductor $L_n$ being connected to port $P_2$ of the lowpass filter 30. A relationship between the order n and the number m is given in the equation n=2*m+3, where n is an odd integer greater than one, and m is a nonnegative integer.

Figure 2:
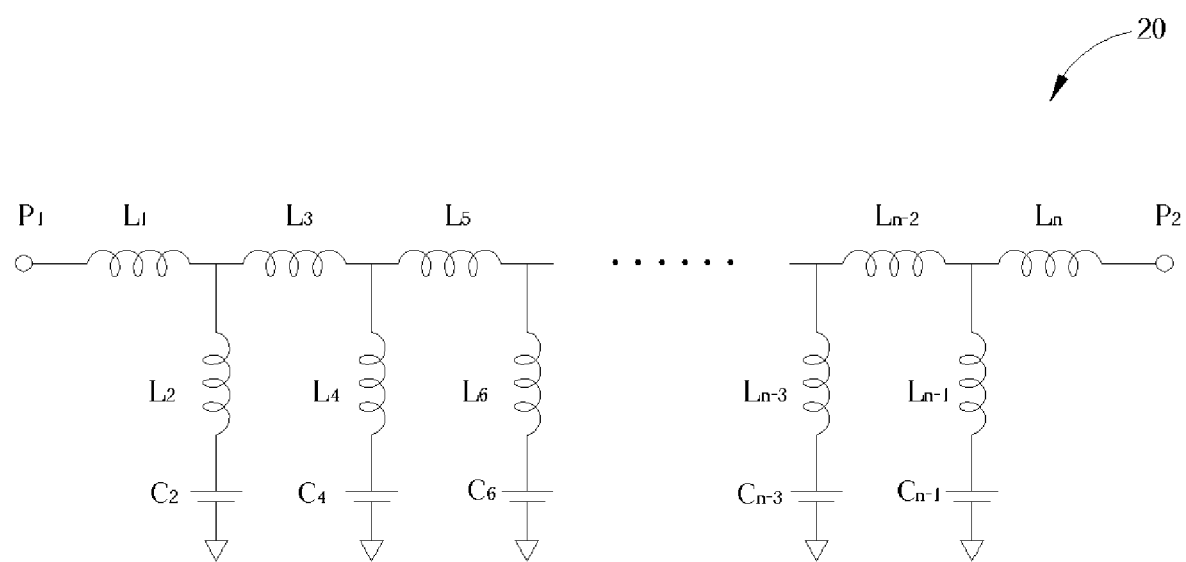
FIG. 2 is a prototype circuit of a conventional $n^{th}$-order elliptic lowpass filter, where n is an odd number.
Figure 3:
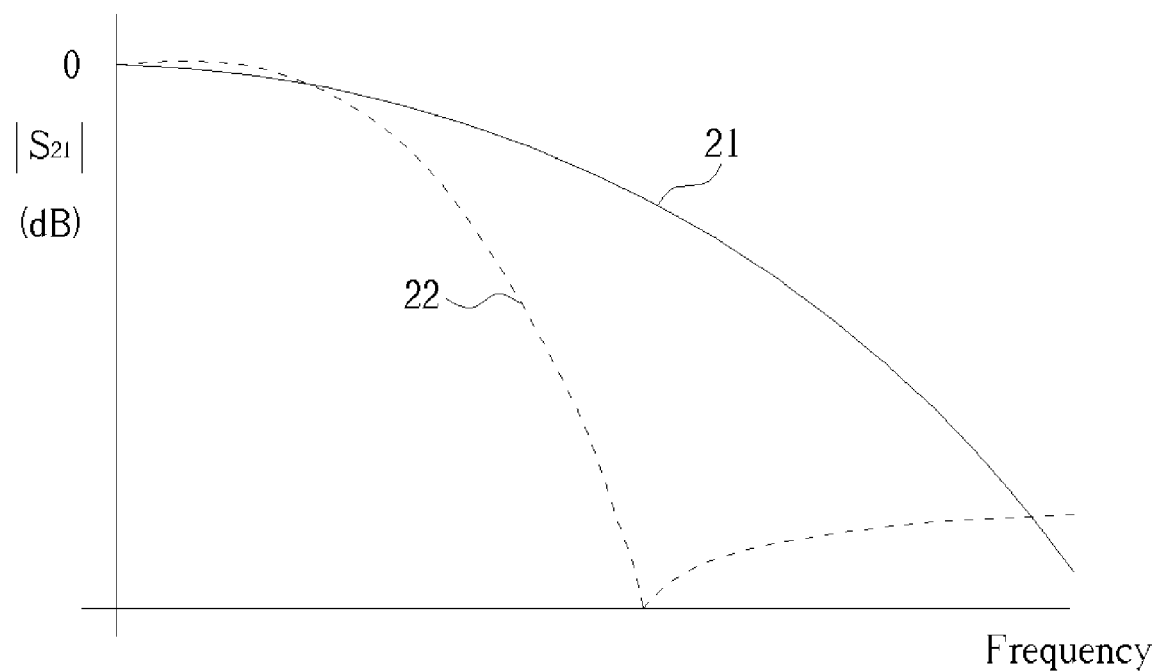
FIG. 3 is a diagram of a frequency response for a conventional third-order lowpass filter and a conventional third-order elliptic lowpass filter.
Figure 5:
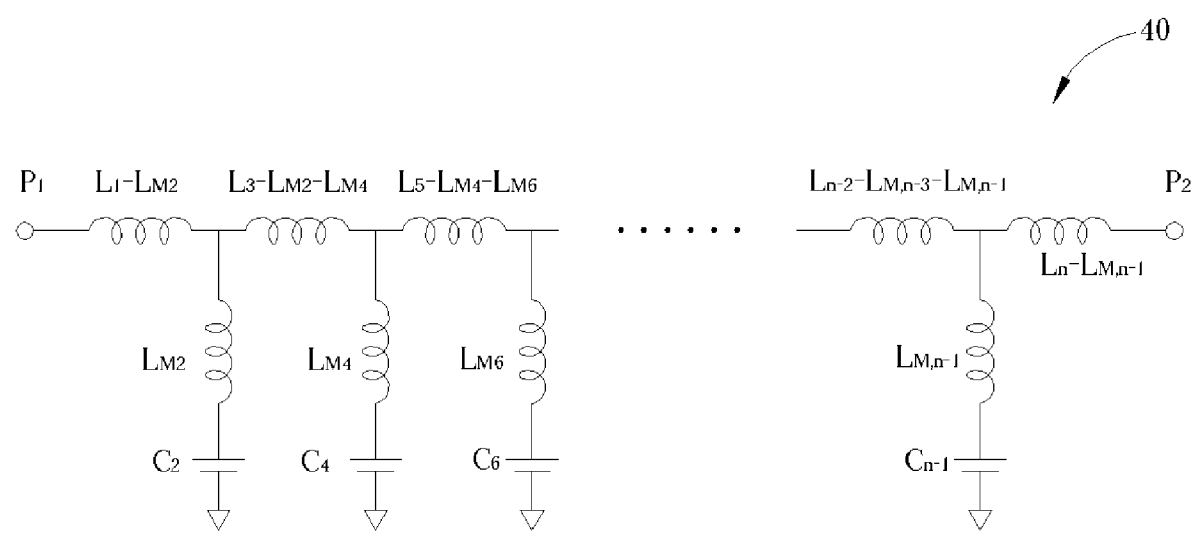
FIG. 5 is an equivalent-circuit model of the proposed lowpass filter shown in FIG. 4.

Please refer to FIG. 5. FIG. 5 is an equivalent-circuit model 40 of the proposed lowpass filter 30 shown in FIG. 4. Each of the negative mutual inductances $L_{Mi}$ shown in FIG. 4 are now modeled in the circuit model 40 as additional inductors $L_{Mi}$ in series with the shunt capacitors $C_i$. The circuit model 40 in FIG. 5 is identical to that of the elliptic lowpass filter 20 shown in FIG. 2. Therefore, the circuit model 30 will have the same frequency response as the elliptic lowpass filter 20 with the advantage of fewer circuit elements. That is, the inductors $L_2, L_4, L_6, \ldots, L_{n-1}$ in series with the shunt capacitors $C_2, c_4, c_6, \ldots, C_{n-1}$ in the conventional elliptic lowpass filter 20 are no longer needed in the present invention, while a negative mutual inductance is established between neighboring series inductors instead. Following the conventional design equations for elliptic lowpass filters, one may obtain the required self inductances $L_1, L_3, L_5, \ldots, L_n$ and mutual inductances $L_{Mi}$ for FIG. 4, and achieve the same performance as that of an elliptic lowpass filter.

As shown in FIG. 5, for each negative mutual inductance that an inductor is involved in, the magnitude of that negative mutual inductance is subtracted from the self inductance of the inductor to produce an effective inductance for the inductor. Two examples will be given to illustrate this effect. The effective inductance of inductor $L_1$, represented as $L_{1eff}$ will be given by the equation $L_{1eff}=L_1-L_{M2}$. Inductor $L_1$ only has one neighboring inductor, which is inductor $L_3$, and therefore is only subject to the effects of one negative mutual inductance $L_{M2}$. The effective inductance of inductor $L_3$, represented as $L_{3eff}$ will be given by the equation $L_{3eff}=L_3-L_{M2}-L_{M4}$. Inductor $L_3$ has two neighboring inductors, which are inductors $L_1$ and $L_5$, and therefore is subject to the effects of two negative mutual inductances $L_{M2}$ and $L_{M4}$.

It is known that the mutual inductance relates to the distance and geometrical relationship between two inductors. Therefore, it is very applicable to implement the present invention in a 3-dimensional structure such as a multi-layered substrate. Based on the aforementioned circuit model of the lowpass filter 30 shown in FIG. 4, a novel lumped-element elliptic lowpass filter with good stopband rejection may be realized in a very small area.

Figure 6:
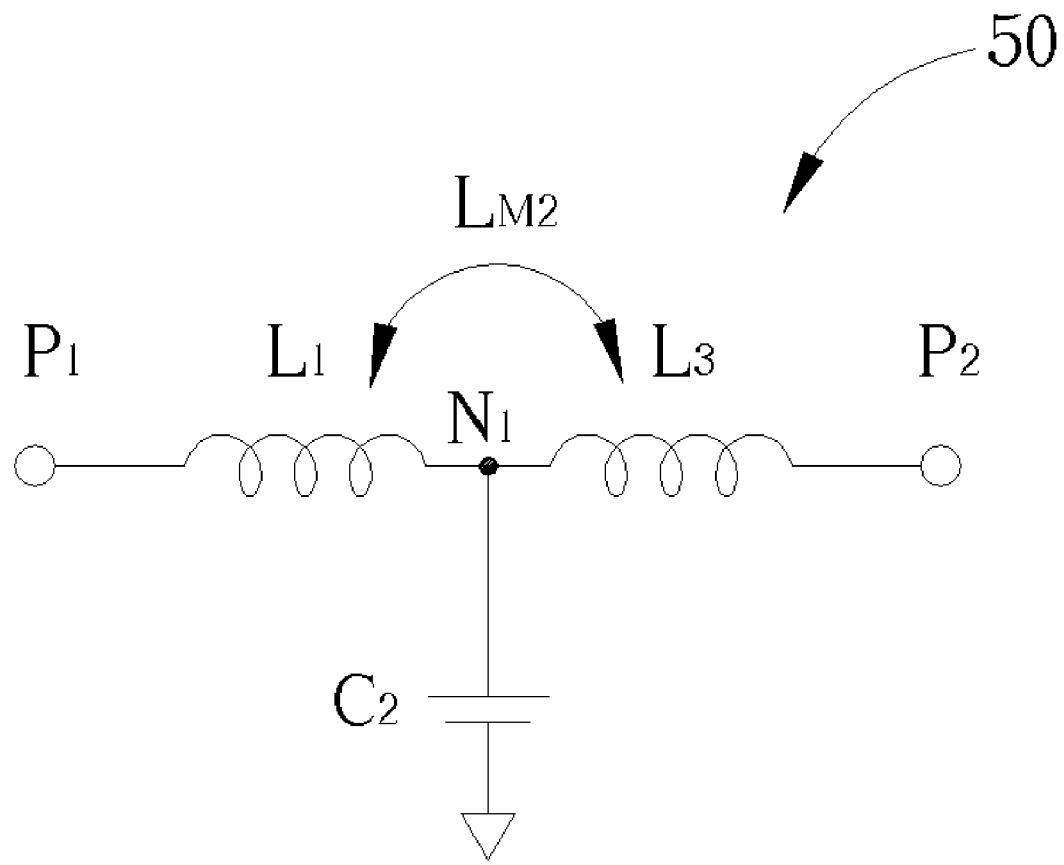
FIG. 6 is a circuit model of a third-order filter according to the present invention.
Figure 7:
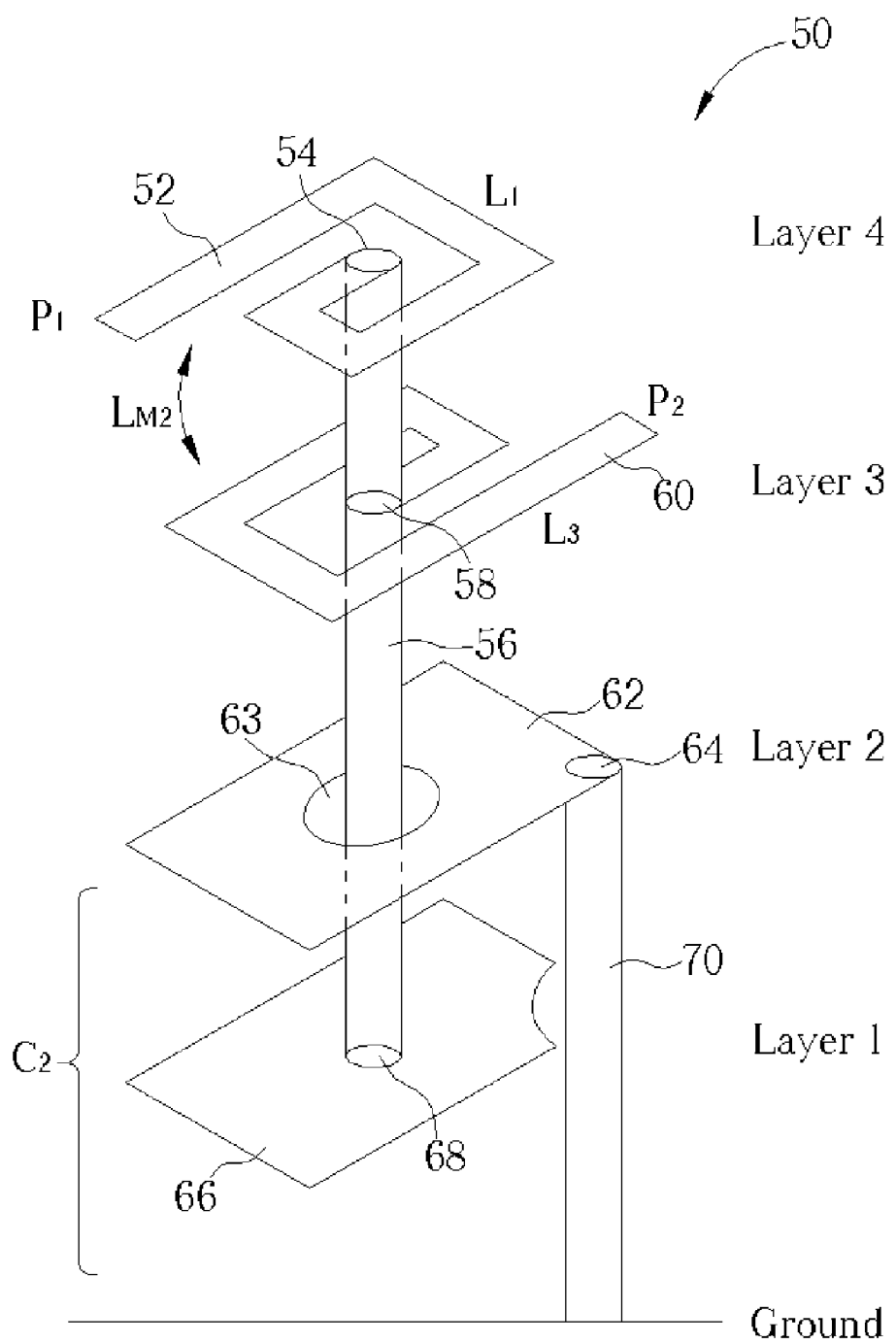
FIG. 7 is a perspective diagram showing the third-order filter realized in a multi-layered substrate with a bottom ground plane according to a first embodiment of the present invention.

Please refer to FIG. 6 and FIG. 7. FIG. 6 is a circuit model of a third-order filter 50 according to the present invention. FIG. 7 is a perspective diagram showing the third-order filter 50 realized in a multi-layered substrate with a bottom ground plane according to a first embodiment of the present invention. A total of four layers are shown plus the ground plane. On layer 4, inductor $L_1$ is formed out of a spiral inductor 52 that may be made out of a spiral metal strip. One end of the spiral inductor 52 is connected to port $P_1$ and the other end of the spiral inductor 52 is connected to a contact node 54. The contact node 54 connects the spiral inductor 52 to a via 56 that extends from layer 1 to layer 4. On layer 3, inductor $L_3$ is formed out of a spiral inductor 60. The spiral inductor 60 is connected between port $P_2$ at one end and to the via 56 through a contact node 58 at the other end. Capacitor $C_2$ is formed between layer 2 and the ground plane. Layer 2 contains a metal plate 62 with a hole 63 formed in it. The via 56 passes through the hole 63, so that the via 56 is not electrically connected to the metal plate 62. Instead, the via 56 extends to layer 1 for connecting to a metal plate 66 at contact node 68. The metal plate 62 is connected to the ground plane through another via 70 that is connected to the metal plate 62 at contact node 64.

Please note that the orientations of the spiral inductor 52 and the spiral inductor 60 are reversed. Having different orientations creates negative mutual inductance between the spiral inductor 52 and the spiral inductor 60. The magnitude of the negative mutual inductance may be adjusted by appropriately adjusting the shapes of the spiral inductors 52 and 60, or by varying the distance between layer 3 and layer 4. The values of self inductances $L_1, L_3$, mutual inductance $L_{M2}$, and the capacitance $C_2$ are designed according to the design equations for a third-order elliptic lowpass filter.

Figure 8:
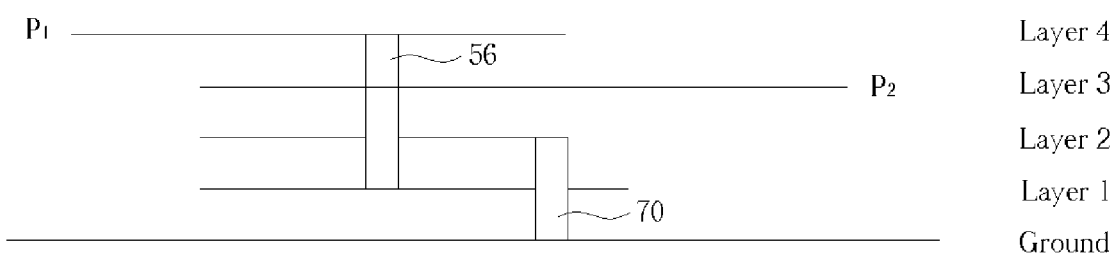
FIG. 8 is a side view of the third-order filter realized in the multi-layered substrate.

Please refer to FIG. 7 and FIG. 8. FIG. 8 is a side view of the third-order filter 50 realized in the multi-layered substrate. The side view shows the via 56 extending from layer 1 to layer 4 and via 70 extending from layer 2 to the ground plane. Due to the circuit elements being stacked up, and due to the use of negative mutual inductance in the design, the resulting third-order filter 50 has a very compact size while achieving good performance as the third-order elliptic lowpass filter.

Figure 9:
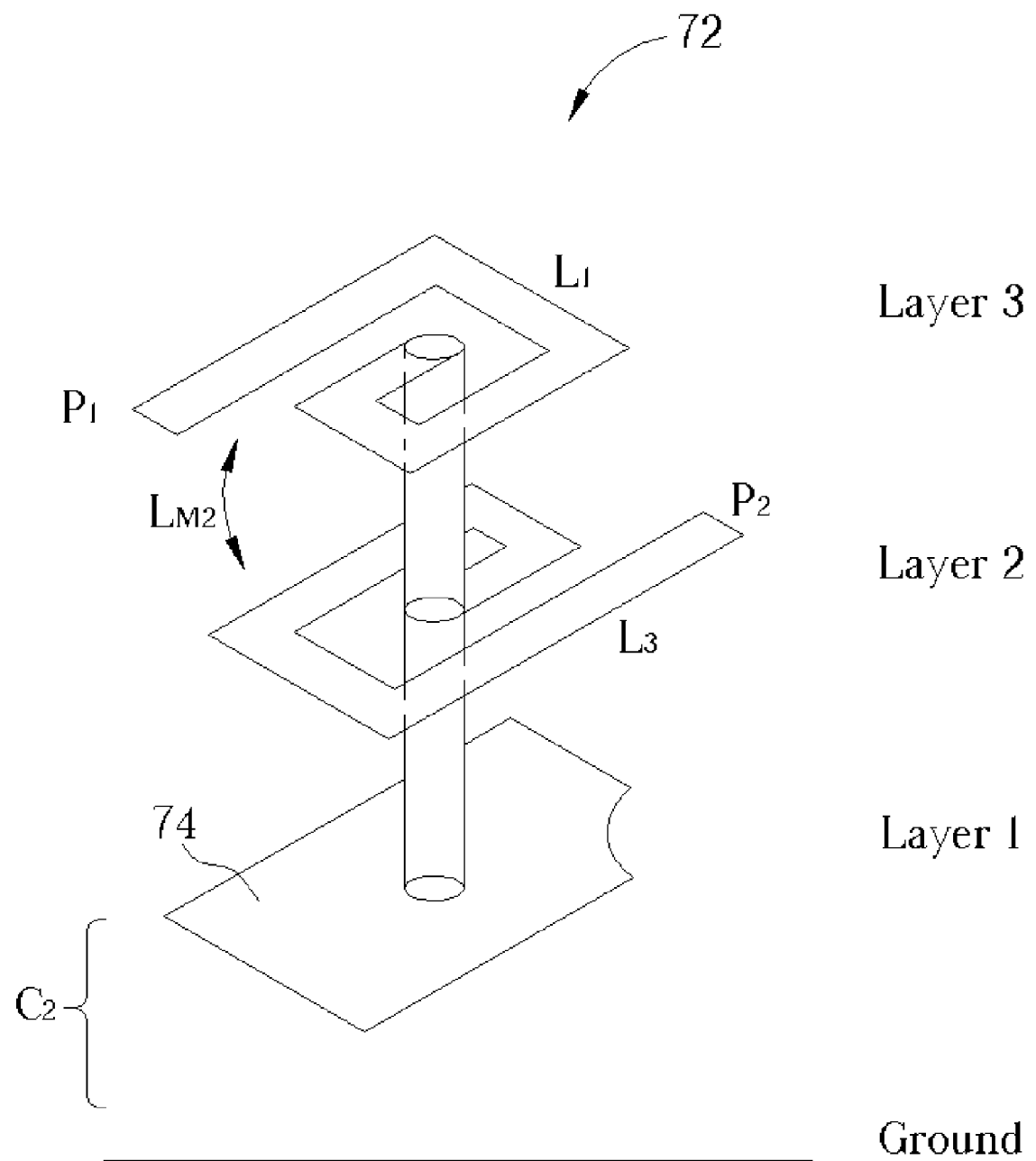
FIG. 9 is a perspective diagram of a third-order filter according to a second embodiment of the present invention.

Please refer to FIG. 9. FIG. 9 is a perspective diagram of a third-order filter 72 according to a second embodiment of the present invention. The third-order filter 72 is similar to the third-order filter 50 of FIG. 7 except the capacitor $C_2$ of the third-order filter 72 is formed on only one layer, which is layer 1. Because the capacitor $C_2$ is formed on only one layer, the third-order filter 72 can be built using one less layer than the third-order filter 50 of FIG. 7.

Figure 10:
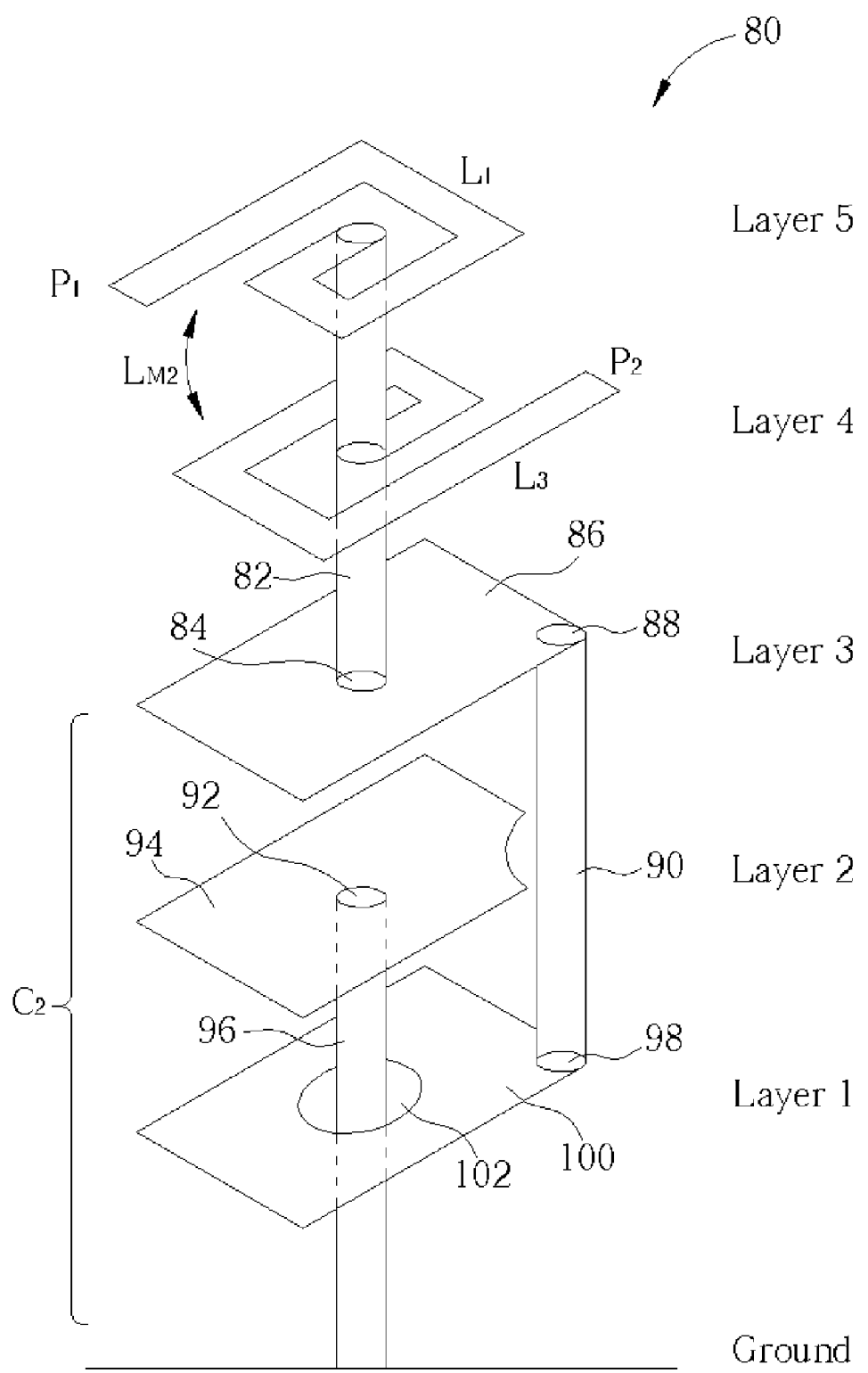
FIG. 10 is a perspective diagram showing a third-order filter realized in a multi-layered substrate according to a third embodiment of the present invention.

Please refer to FIG. 10. FIG. 10 is a perspective diagram showing a third-order filter 80 realized in a multi-layered substrate according to a third embodiment of the present invention. The third-order filter 80 is realized in a total of five layers plus the ground plane. Layers 4 and 5 of the third-order filter 80 are exactly the same as layers 3 and 4 of the third-order filter 50 shown in FIG. 7. Instead of using two layers containing metal sheets to form capacitor $C_2$, the third-order filter 80 forms the capacitor $C_2$ out of three layers of metal sheets. On layer 3, a metal sheet 86 connects to a via 82 at contact node 84. The metal sheet 86 connects to another via 90 at contact node 88. The via 90 serves to connect the metal sheet 86 on layer 3 to a metal sheet 100 on layer 1 through contact node 98. Therefore, the metal sheet 86 is electrically connected to the metal sheet 100 for providing a larger effective capacitive area. Another metal sheet 94 is formed on layer 2, and is connected to via 96 through a contact node 92. The via 96 passes through a hole 102 in the metal sheet 100 of layer 1, and connects the metal sheet 94 to the ground plane. The third-order filter 50 in FIG. 7 used two layers of the multi-layered substrate to form capacitor $C_2$, and the third-order filter 80 in FIG. 10 used three layers. Please note that a greater number of layers can also be used to increase the effective area of the capacitor $C_2$, thereby increasing its capacitance or reducing the required area on each layer for a given capacitance value.

Figure 11:
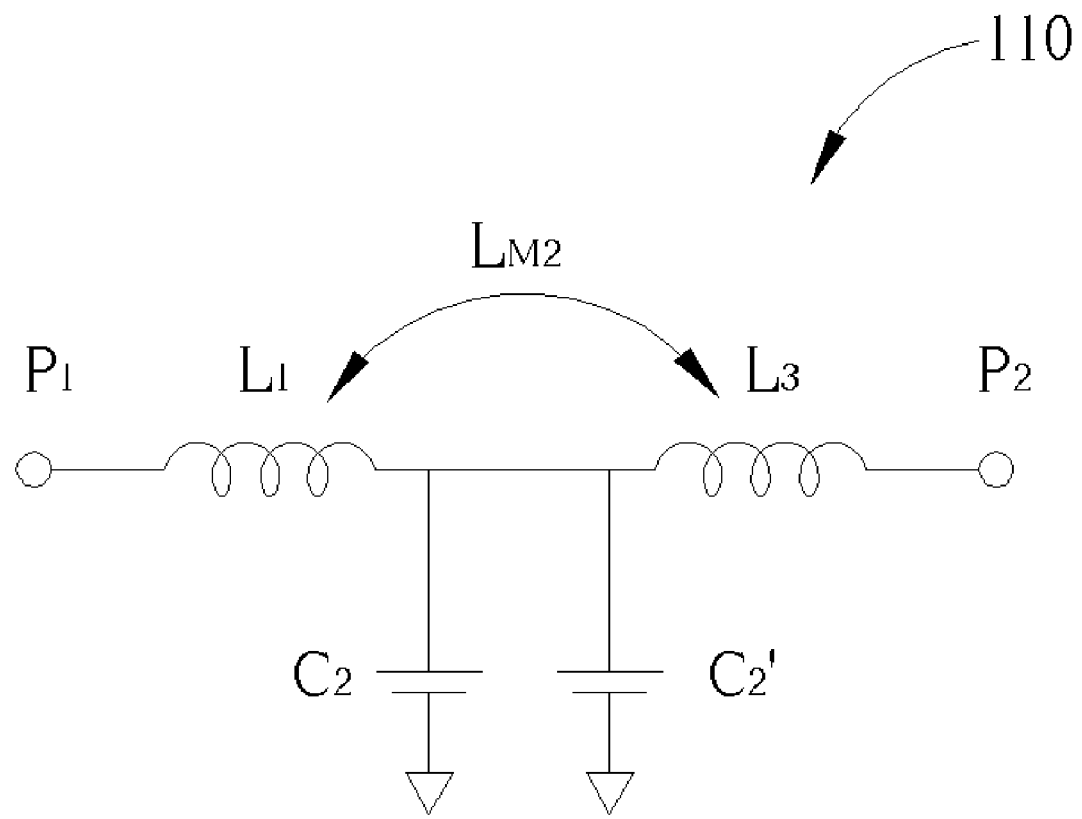
FIG. 11 is a circuit model of another third-order filter according to the present invention.
Figure 12:
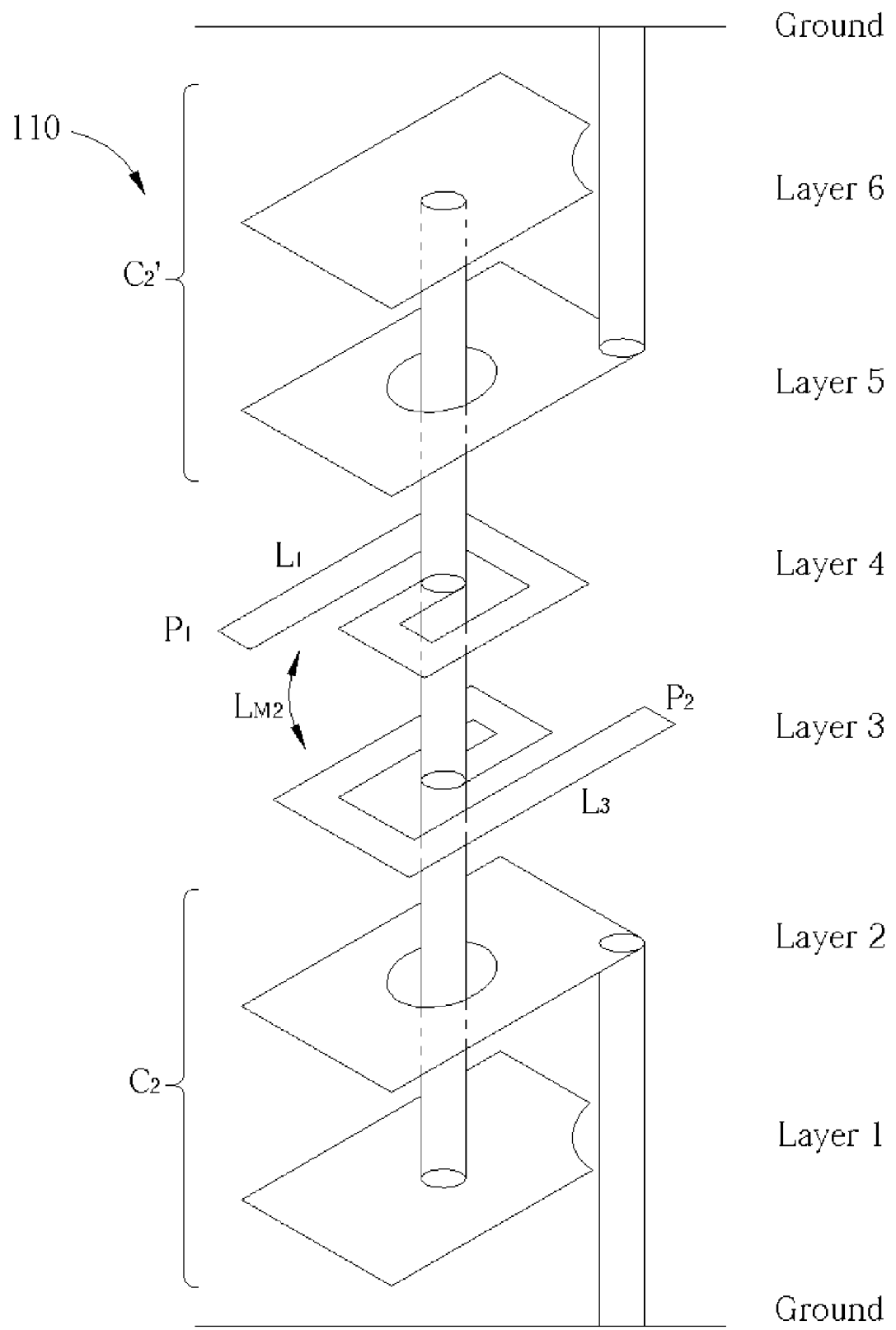
FIG. 12 is a perspective diagram showing the third-order filter realized in a multi-layered substrate according to a fourth embodiment of the present invention.

Please refer to FIG. 11 and FIG. 12. FIG. 11 is a circuit model of another third-order filter 110 according to the present invention. FIG. 12 is a perspective diagram showing the third-order filter 110 realized in a multi-layered substrate according to a fourth embodiment of the present invention. The third-order filter 110 is an alternative configuration of the third-order filter 50 shown in FIG. 6. Instead of having the single shunt capacitor $C_2$, the third-order filter 110 has two shunt-connected capacitors $C_2$ and $C_2''$. The capacitors $C_2$ and $C_2''$ are connected in parallel, so the total capacitance can be added linearly. Therefore, by having the two capacitors $C_2$ and $C_2''$, each of the capacitors $C_2$ and $C_2''$ can be made smaller. The main difference between the third-order filter 110 shown in FIG. 12 and the third-order filter 50 shown in FIG. 7 is that two extra layers (layers 5 and 6) are used to form the additional capacitor $C_2''$.

Figure 13:
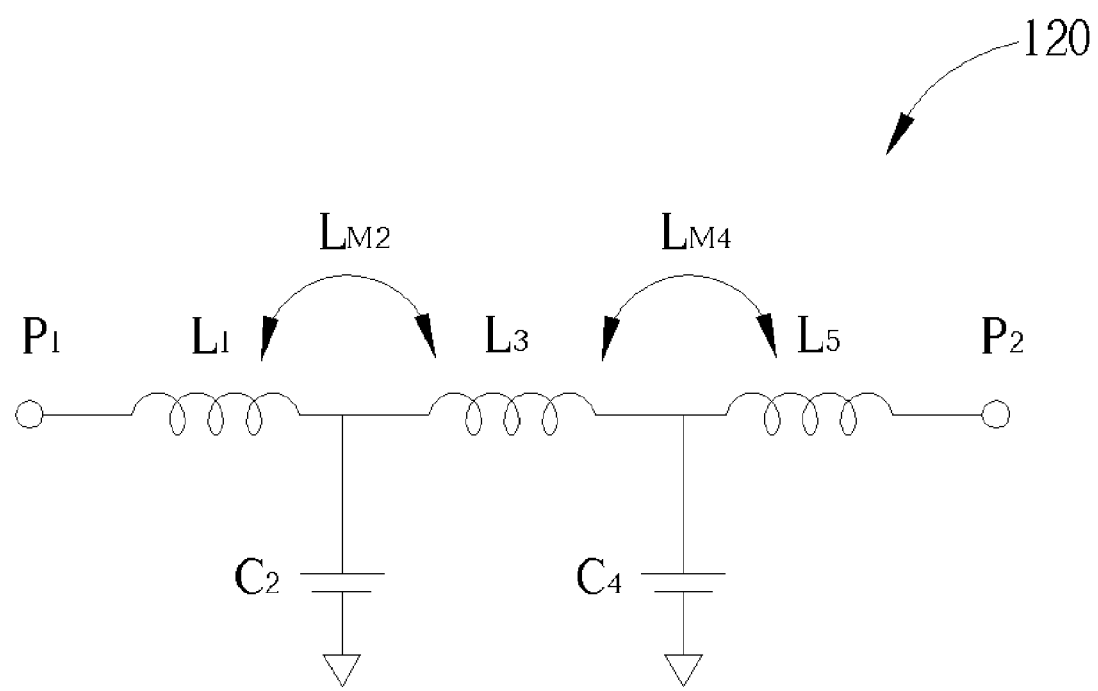
FIG. 13 is a circuit model of a fifth-order filter according to the present invention.
Figure 14:
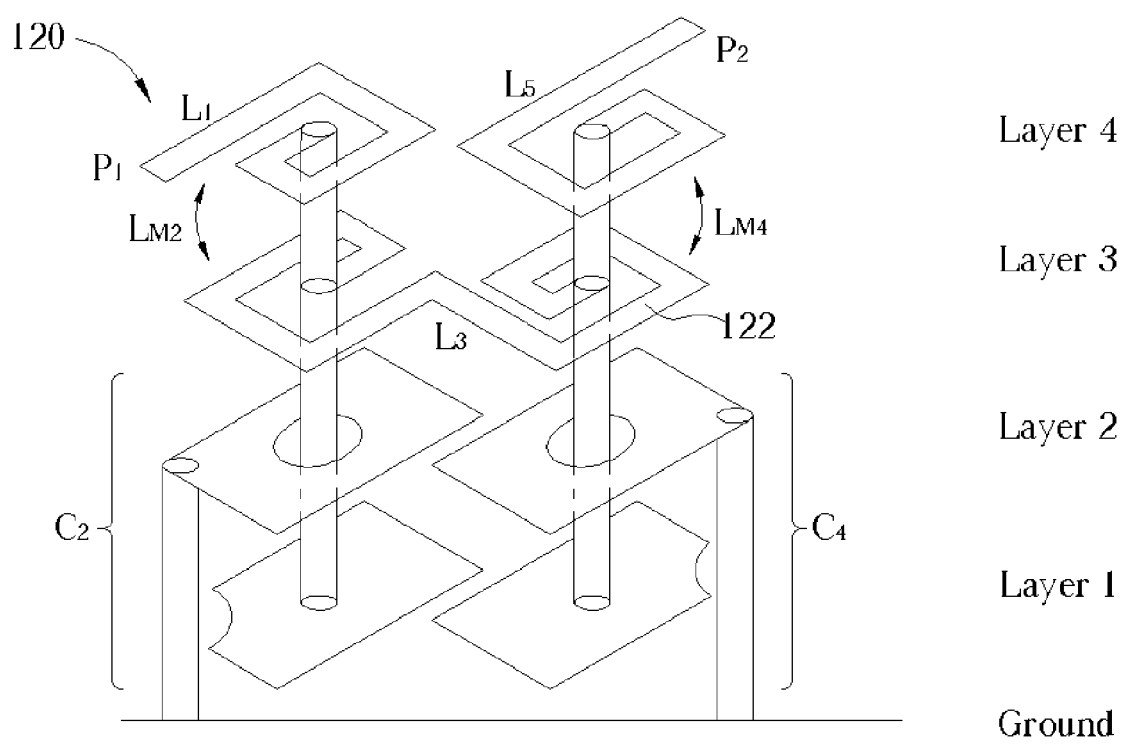
FIG. 14 is a perspective diagram showing the fifth-order filter realized in a multi-layered substrate according to a fifth embodiment of the present invention.

Please refer to FIG. 13 and FIG. 14. FIG. 13 is a circuit model of a fifth-order filter 120 according to the present invention. FIG. 14 is a perspective diagram showing the fifth-order filter 120 realized in a multi-layered substrate according to a fifth embodiment of the present invention. The fifth-order filter 120 is accomplished by cascading together two third-order filter structures, such as the third-order filter 50 shown in FIG. 7. Increasing the order of filter can improve the roll-off rate at the passband edge and the rejection in the stopband. This is achieved at the expense of increasing the circuit area.

On layer 3, a spiral inductor 122 that forms inductor $L_3$ connects a left side of the fifth-order filter 120 to a right side of the fifth-order filter 120. Inductors $L_1$ and $L_5$ are formed on layer 1 and capacitors $C_2$ and $C_4$ are formed between layer 2 and the ground plane. When two third-order filter structures are cascaded together, a fifth-order filter is formed, when three third-order filter structures are cascaded together, a seventh-order filter is formed, and so on. Since the mutual inductance between neighboring metal strips on the same substrate layer is much smaller than that between two stacked metal strips on different layers, the mutual inductance between inductor $L_1$ and $L_5$ can be neglected and only the mutual inductances between $L_1$ and $L_3$, and between $L_3$ and $L_5$ are considered. In addition, the mutual inductance between inductor $L_1$ and inductor $L_3$ is mainly due to the left-hand side of inductor $L_3$, and the mutual inductance between inductor $L_1$ and the right-hand side of inductor $L_3$ is negligible. Similarly, the mutual inductance between inductor $L_5$ and the left-hand side of inductor $L_3$ is negligible.

Figure 15:
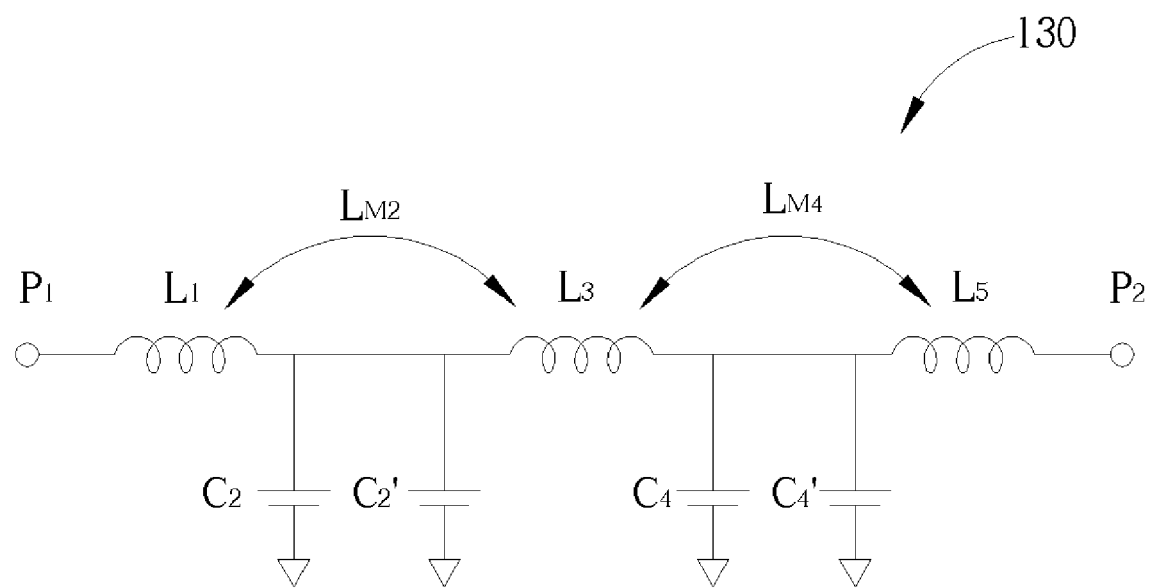
FIG. 15 is a circuit model of another fifth-order filter according to the present invention.
Figure 16:
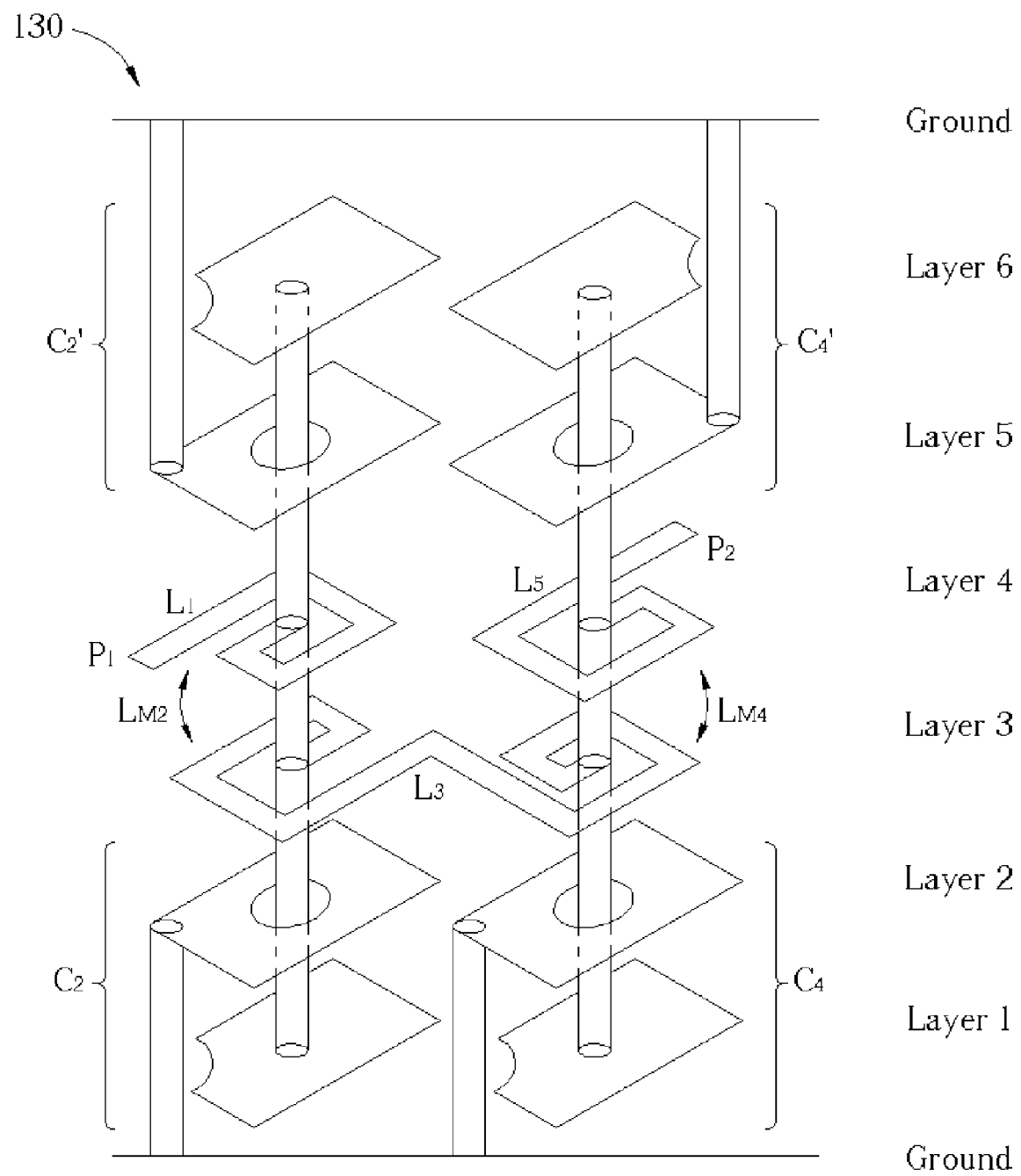
FIG. 16 is a perspective diagram showing the fifth-order filter realized in a multi-layered substrate according to a sixth embodiment of the present invention.

Please refer to FIG. 15 and FIG. 16. FIG. 15 is a circuit model of another fifth-order filter 130 according to the present invention. FIG. 16 is a perspective diagram showing the fifth-order filter 130 realized in a multi-layered substrate according to a sixth embodiment of the present invention. The fifth-order filter 130 is accomplished by cascading together two third-order filter structures like the third-order filter 110 shown in FIG. 12. The fifth-order filter 130 contains two pairs of shunt-connected capacitors $C_2$ and $C_2''$, and $C_4$ and $C_4''$.

Figure 17:
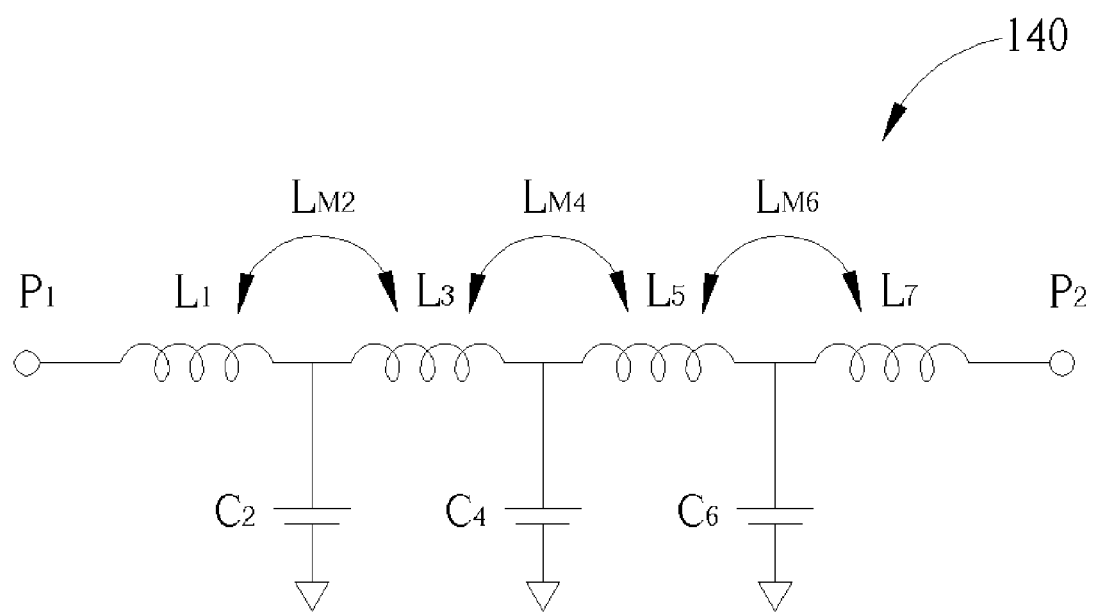
FIG. 17 is a circuit model of a seventh-order filter according to the present invention.
Figure 18:
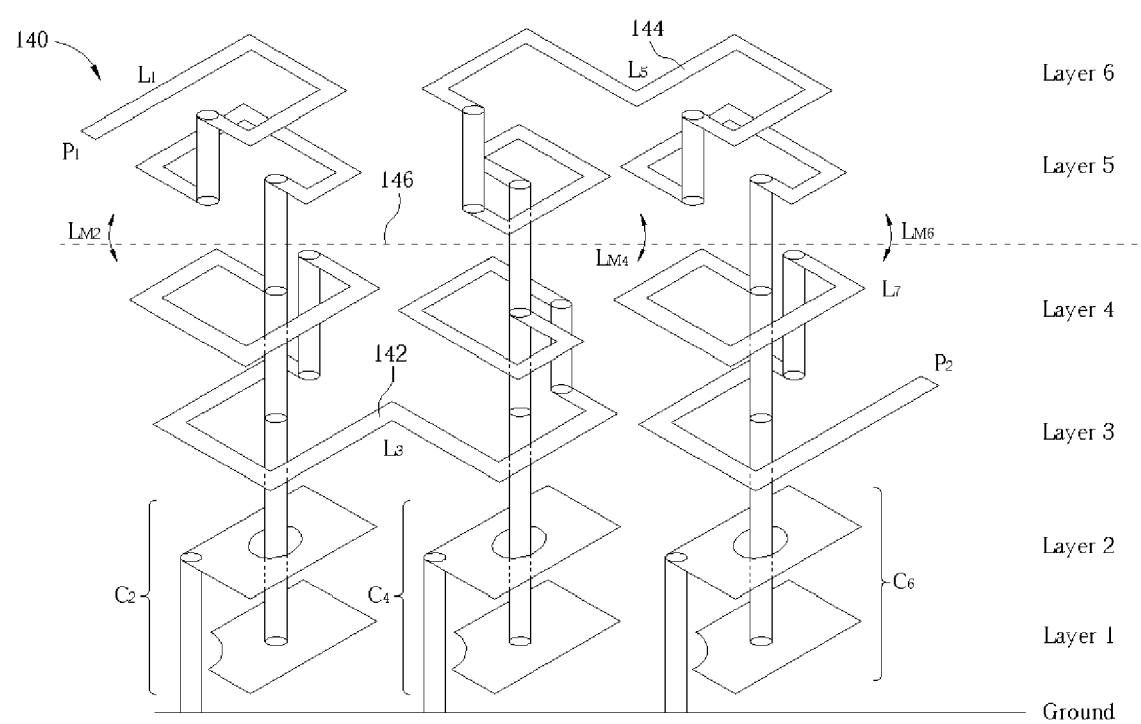
FIG. 18 is a perspective diagram showing the seventh-order filter realized in a multi-layered substrate according to a seventh embodiment of the present invention.

Based on the same principle, lowpass filters with a higher order can also be built to achieve better performance. Please refer to FIG. 17 and FIG. 18. FIG. 17 is a circuit model of a seventh-order filter 140 according to the present invention. FIG. 18 is a perspective diagram showing the seventh-order filter 140 realized in a multi-layered substrate according to a seventh embodiment of the present invention. The seventh-order filter 140 is accomplished by cascading together three third-order filter structures. The progression from the fifth-order filter 120 to the seventh-order filter 140 is trivial after the difference between the third-order filter 50 and the fifth-order filter 120 is understood.

On layers 3 and 4, a spiral inductor 142 that forms inductor $L_3$ connects a left section of the seventh-order filter 140 to a middle section of the seventh-order filter 140. In the same way, on layers 5 and 6, a spiral inductor 144 that forms inductor $L_5$ connects the middle section of the seventh-order filter 140 to a right section of the seventh-order filter 140. One difference from the fifth-order filter 120 is that in the seventh-order filter 140, each inductor is formed on two layers of the multi-layered substrate. A dotted line 146 is drawn on FIG. 18 to indicate the dividing lines between inductors $L_1$ and $L_3$, and also between inductors $L_5$ and $L_7$. Therefore, inductors $L_1$ and $L_5$ are each formed on layers 5 and 6 of the multi-layered substrate, and inductors $L_3$ and $L_7$ are each formed on layers 3 and 4 of the multi-layered substrate. Forming the inductors on multiple layers allows larger inductances to be created while reducing the area required by the inductors.

In summary, the present invention lowpass filter utilizes a negative mutual inductance between inductors for improving the rejection in the stopband. The elliptic lowpass filter of the present invention is preferably formed in a multi-layered ceramic substrate, such as a low temperature co-fired ceramic (LTCC) substrate, for reducing the size of the filter. For circuits in all of the embodiments described above, the spiral inductors can be rectangular, circular, or octagonal in shape. The inductors can also occupy more than one layer for creating larger inductance values or for controlling the mutual inductance between them. Similarly, the capacitors can also be implemented on more substrate layers to achieve higher capacitance values in a smaller area, or on less substrate layers for reducing the required number of layers. The number of layers versus the area per layer can be optimized according to size and cost restraints. Each of the capacitors used in the lowpass filter can be a metal-insulation-metal (MIM) capacitor.

Good rejection in the stopband of the present invention lowpass filter has been proven by experiment, and better roll-off rate at passband edge than that of a conventional lowpass filter of the same order is observed. The negative mutual inductance introduced between adjacent inductors gives the lowpass filter having a structure of a conventional lowpass filter the frequency response of a conventional elliptic lowpass filter. The lowpass filters of the present invention can thus be built using fewer inductors, and requiring a smaller circuit area.

Compared to the prior art, with the utilization of the negative mutual inductance, the rejection in the stopband of the present invention lumped-element lowpass filter is improved without adding additional circuit elements.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A lowpass filter formed in a multi-layered substrate comprising:
   a first inductor having one end electrically connected to a first node;
   a second inductor having one end electrically connected to a second node;
   a third inductor having one end electrically connected to the first node and another end electrically connected to the second node, wherein the third inductor is formed on different layers of the multi-layered substrate than the first and second inductors;
   a first capacitor formed on at least one layer of the multi-layered substrate and being electrically connected to the first node and to ground; and
   a second capacitor formed on at least one layer of the multi-layered substrate and being electrically connected to the second node and to ground;
   wherein negative mutual inductance exists between the first and third inductors and between the second and third inductors.

2. The lowpass filter of claim 1, further comprising:
   a first via for electrically connecting the first inductor, the third inductor, and the first capacitor at the first node; and
   a second via for electrically connecting the second inductor, the third inductor, and the second capacitor at the second node.

3. The lowpass filter of claim 1, wherein the first capacitor comprises a first metal sheet electrically connected to the first node and a second metal sheet electrically connected to ground, and the second capacitor comprises a third metal sheet electrically connected to the second node and a fourth metal sheet electrically connected to ground.

4. The lowpass filter of claim 1, wherein the first, second, and third inductors are formed out of metal strips.

5. The lowpass filter of claim 4, wherein the metal strips are patterned in spiral shapes.

6. A lowpass filter formed in a multi-layered substrate comprising:
   a first layer of the multi-layered substrate comprising a first inductor having one end electrically connected to a first node and a second inductor having one end electrically connected to a second node;
   a second layer of the multi-layered substrate comprising a third inductor having one end electrically connected to the first node and another end electrically connected to the second node;
   a third layer of the multi-layered substrate comprising a first metal sheet electrically connected to ground and a second metal sheet electrically connected to ground; and
   a fourth layer of the multi-layered substrate comprising a third metal sheet electrically connected to the first node and a fourth metal sheet electrically connected to the second node, wherein the first and third metal sheets constitute a first capacitor and the second and fourth metal sheets constitute a second capacitor;
   wherein negative mutual inductance exists between the first and third inductors and between the second and third inductors.

7. The lowpass filter of claim 6, further comprising:
   a first via for electrically connecting the first inductor, the third inductor, and the first capacitor at the first node; and
   a second via for electrically connecting the second inductor, the third inductor, and the second capacitor at the second node.

8. The lowpass filter of claim 6, wherein the first, second, and third inductors are formed out of metal strips.

9. The lowpass filter of claim 8, wherein the metal strips are patterned in spiral shapes.

* * * * *